(12) United States Patent
Choi et al.

(10) Patent No.: US 10,594,303 B2
(45) Date of Patent: Mar. 17, 2020

(54) TEMPERATURE SENSOR CIRCUIT AND SEMICONDUCTOR DEVICE INCLUDING THE SAME

(71) Applicants: SK hynix Inc., Icheon (KR); University Of Seoul Industry Cooperation Foundation, Seoul (KR)

(72) Inventors: Joongho Choi, Seongnam (KR); Hyeondeok Jeon, Seoul (KR)

(73) Assignees: SK hynix Inc., Icheon (KR); University Of Seoul Industry Cooperation Foundation, Seoul (KR)

( * ) Notice: Subject to any disclaimer, the term of this patent is extended or adjusted under 35 U.S.C. 154(b) by 0 days.

(21) Appl. No.: 16/221,341

(22) Filed: Dec. 14, 2018

(65) Prior Publication Data

US 2019/0207591 A1 Jul. 4, 2019

(30) Foreign Application Priority Data

Dec. 29, 2017 (KR) .......................... 10-2017-0184068

(51) Int. Cl.
| | |
|---|---|
| *G01K 7/34* | (2006.01) |
| *H03K 3/03* | (2006.01) |
| *H03K 5/133* | (2014.01) |
| *H03K 5/134* | (2014.01) |
| *G01K 7/32* | (2006.01) |
| *H03K 5/00* | (2006.01) |

(52) U.S. Cl.
CPC ............. *H03K 3/0315* (2013.01); *G01K 7/32* (2013.01); *G01K 7/346* (2013.01); *H03K 5/133* (2013.01); *H03K 5/134* (2014.07); *G01K 2219/00* (2013.01); *H03K 2005/00071* (2013.01)

(58) Field of Classification Search
CPC ...... G01K 7/32; G01K 7/346; G01K 2219/00; H03K 3/0315; H03K 3/0322; H03K 5/133; H03K 5/134; H03K 2005/00071
USPC .......................................................... 331/57
See application file for complete search history.

(56) References Cited

U.S. PATENT DOCUMENTS

| | | | |
|---|---|---|---|
| 7,804,372 B2 | 9/2010 | Nakatani | |
| 2016/0266552 A1 | 9/2016 | Shimada et al. | |
| 2017/0187358 A1* | 6/2017 | Takeuchi | ............... H03K 3/011 |

FOREIGN PATENT DOCUMENTS

JP 4843034 B2 12/2011

* cited by examiner

*Primary Examiner* — Levi Gannon (57) ABSTRACT

A temperature sensor circuit may include a ring oscillator being enabled according to an enable signal and outputting a square wave signal with a first frequency, a divider dividing the first frequency of the square wave signal from the ring oscillator to generate a pulse signal with a second frequency, a counter counting a time interval of the pulse signal outputted from the divider according to an external clock to generate a count signal, a latch temporarily storing a value of the counter signal according to the pulse signal and outputting a digital code, and a supply voltage monitor being enabled according to the pulse signal, comparing a reference voltage to one or more comparison voltages and generating a switching logic signal. The reference voltage is kept at a substantially constant level when a level of a supply voltage changes.

20 Claims, 5 Drawing Sheets

TEMPERATURE SENSOR CIRCUIT AND SEMICONDUCTOR DEVICE INCLUDING THE SAME

CROSS-REFERENCE TO RELATED APPLICATION

This application claims priority under 35 U.S.C. § 119 to Korean Patent Application No. 10-2017-0184068 filed on Dec. 29, 2017, which is incorporated herein by reference in its entirety.

BACKGROUND

1. Field

Embodiments relate to a temperature sensor circuit and a semiconductor device including the same, and more particularly, to a temperature sensor circuit capable of correcting a propagation delay change that depends on different supply voltages, and a semiconductor device including the same.

2. Discussion of the Related Art

Mobile communication technology has implemented a variety of services which enable a user to make a voice call, send/receive a Short Message Service (SMS), watch a video such as drama or movie, or execute a game through a mobile device. Thus, research has been conducted on technologies for increasing the battery usage time of mobile devices. For example, a temperature sensor is included in a semiconductor integrated circuit of a mobile device, for example, a digital signal processor, in order to detect a temperature of the mobile device.

When the temperature of the mobile device is maintained in a predetermined temperature range using the temperature sensor and a controller, it is possible to prevent a performance reduction of the mobile device, to improve the reliability of the mobile device, and to prevent an irreparable damage caused by overheating. Moreover, the size of a heat sink and the discharge power of a battery can be reduced, and thus the mobile device needs to efficiently consume power.

The temperature sensor circuit may be optimized to use a predetermined supply voltage supplied to a semiconductor device, for example, a voltage level of 1V. However, a supply voltage having a different voltage level (e.g., 0.9V or 1.1V) may be supplied to a semiconductor device. In this case, temperature detection may be inaccurately performed due to a change in a propagation delay of a circuit element (e.g., an inverter in a ring oscillator) in the temperature sensor circuit, which results from a variation in the supply voltage.

SUMMARY

Various embodiments are directed to a temperature sensor circuit capable of correcting a propagation delay caused by different supply voltages, and a semiconductor device including the same.

In an embodiment, a temperature sensor circuit may include: a ring oscillator suitable for being enabled according to an enable signal, and outputting a square wave signal with a first frequency; a divider suitable for dividing the first frequency of the square wave signal from the ring oscillator to generate a pulse signal with a second frequency; a counter suitable for counting a time interval of the pulse signal outputted from the divider according to an external clock to generate a count signal; a latch suitable for temporarily storing a value of the counter signal according to the pulse signal, and outputting a digital code; and a supply voltage monitor suitable for being enabled according to the pulse signal, comparing a reference voltage to one or more comparison voltages and generating a switching logic signal, the reference voltage being kept at a substantially constant level when a level of a supply voltage changes.

In the other embodiment, a semiconductor device may include: a first circuit disposed on a first portion of a semiconductor substrate; and a second circuit disposed on a second portion of the semiconductor substrate, wherein each of the first and second circuits comprises a temperature sensor circuit, the temperature sensor circuit comprising: a ring oscillator suitable for being enabled according to an enable signal, and outputting a square wave signal with a first frequency; a divider suitable for dividing the first frequency of the square wave signal from the ring oscillator to generate a pulse signal with a second frequency; a counter suitable for counting a time interval of the pulse signal outputted from the divider according to an external clock to generate a count signal; a latch suitable for temporarily storing a value of the counter signal according to the pulse signal, and outputting a digital code; and a supply voltage monitor suitable for being enabled according to the pulse signal, comparing a reference voltage to one or more comparison voltages and generating a switching logic signal. The reference voltage is kept at a substantially constant level when a level of a supply voltage changes.

In another embodiment, a semiconductor device comprises: a first circuit disposed on a first portion of a semiconductor substrate; and a second circuit disposed on a second portion of the semiconductor substrate wherein each of the first and second circuits comprises a temperature sensor circuit. The temperature sensor circuit comprises: a ring oscillator suitable for being enabled according to an enable signal, and outputting a square wave signal with a first frequency; a divider suitable for dividing the first frequency of the square wave signal from the ring oscillator to generate a pulse signal with a second frequency; a counter suitable for counting a time interval of the pulse signal outputted from the divider according to an external clock to generate a count signal; a latch suitable for temporarily storing a value of the counter signal according to the pulse signal, and outputting a digital code; and a supply voltage monitor suitable for being enabled according to the pulse signal, comparing a reference voltage to one or more comparison voltages and generating a switching logic signal, the reference voltage being kept at a substantially constant level when a level of a supply voltage changes. The supply voltage monitor comprises: a reference voltage generation circuit suitable for receiving the supply voltage and generating the reference voltage; a comparison voltage generation circuit suitable for generating the comparison voltages having different levels that are proportional to the level of the supply voltage; a comparison circuit suitable for comparing the reference voltage and the comparison voltages and generating a plurality of comparison signals indicating respective comparison values; and an analog-to-digital converter suitable for converting value of the plurality of comparison signals into digital values and generating the switching logic signal indicative of the digital values.

DETAILED DESCRIPTION

Hereafter, various embodiments will be described below in more detail with reference to the accompanying drawings. Throughout the disclosure, like reference numerals refer to like parts throughout the various figures and embodiments of the present invention. Furthermore, in the following descriptions, specific details are illustrated. However, the specific details are only provided to promote understandings of embodiments of the present disclosure. Moreover, detailed descriptions related to well-known functions or configurations may be ruled out in order not to unnecessarily obscure subject matters of embodiments of the present disclosure.

Figure 1:
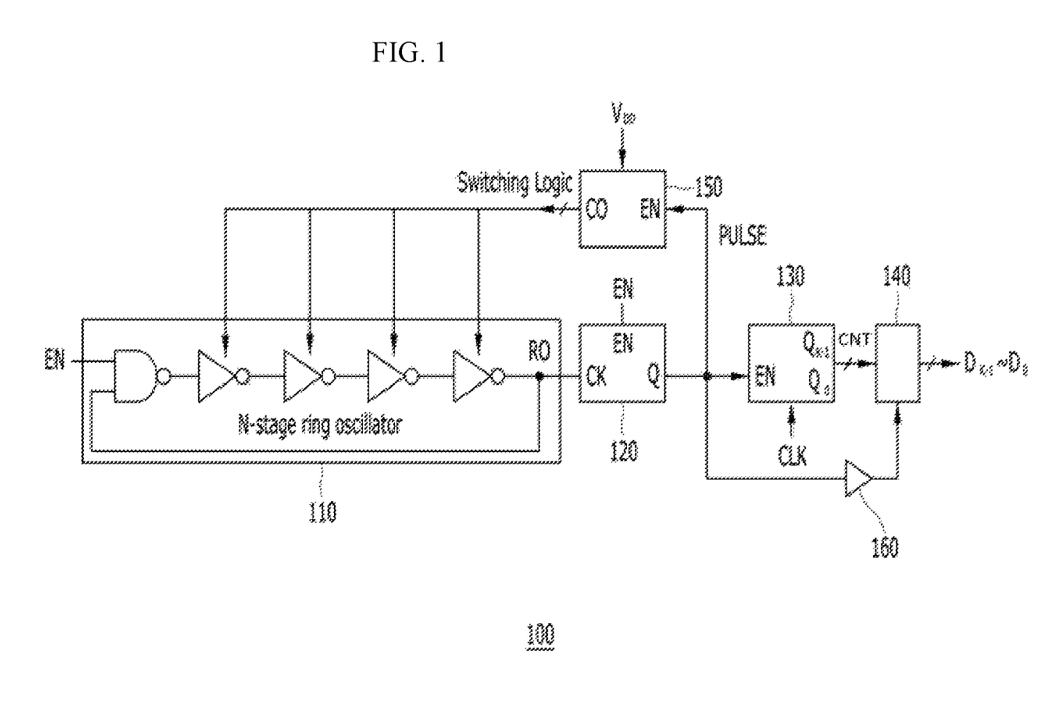
FIG. 1 illustrates a temperature sensor circuit in accordance with an embodiment.

FIG. 1 illustrates a temperature sensor circuit 100 in accordance with an embodiment.

The temperature sensor circuit 100 includes a ring oscillator 110, a divider (e.g., a frequency divider) 120, a counter 130, a latch 140, a supply voltage monitor (or a supply voltage monitor circuit) 150, and a buffer 160.

The ring oscillator 110 is enabled according to an enable signal EN applied from outside, and outputs a square wave signal RO with a predetermined oscillation frequency.

The divider 120 divides the oscillation frequency of the square wave signal RO outputted from the ring oscillator 110 by a given dividing factor, and outputs a divided pulse (or a divided pulse signal) PULSE.

The counter 130 counts the divided pulse PULSE outputted from the divider 120 according to an external clock CLK applied from outside, and outputs a count signal CNT indicating a count value. In an embodiment, the count signal CNT has a K-bit value and the count value indicates a number of a plurality of pulses of the external clock CLK corresponding to an on-time duration of the divided pulse PULSE.

The latch 140 temporarily stores the count value of the count signal CNT outputted from the counter 130 according to the divided pulse PULSE outputted from the divider 120, and outputs a k-bit temporarily stored digital code $D_0$ to $D_{k-1}$ according to an output of the buffer 160 which buffers the divided pulse PULSE.

The supply voltage monitor 150 is enabled according to the divided pulse PULSE outputted from the divider 120, compares a reference voltage to a plurality of comparison voltages having different levels, which are generated in proportion to the temperature, and output a switching logic signal Switching Logic indicating the comparison result. While the source voltage VDD increases as the temperature increases, a plurality of comparison voltages (e.g., a plurality of comparison voltage Vcomp(1) to Vcomp(k) shown in FIG. 2) increase. While the source voltage VDD decreases as the temperature decreases, the plurality of comparison voltages Vcomp(1) to Vcomp(k) decrease.

When the temperature rises, the width of the square wave signal RO outputted from the ring oscillator 110 increases. On the other hand, when the temperature falls, the width of the square wave signal RO outputted from the ring oscillator 110 decreases. The temperature sensor circuit 100 detects the temperature of a semiconductor device using the number of square wave signals RO that is indirectly counted by the counter 130. For example, when the temperature increases, a period of the square wave signal RO increases, and thus a period of the divided PULSE also increases. As a result, the count value indicating a number of pulses of the clock signal CLK included in an on-time duration of the divided pulse PULSE also increases.

Figure 2:
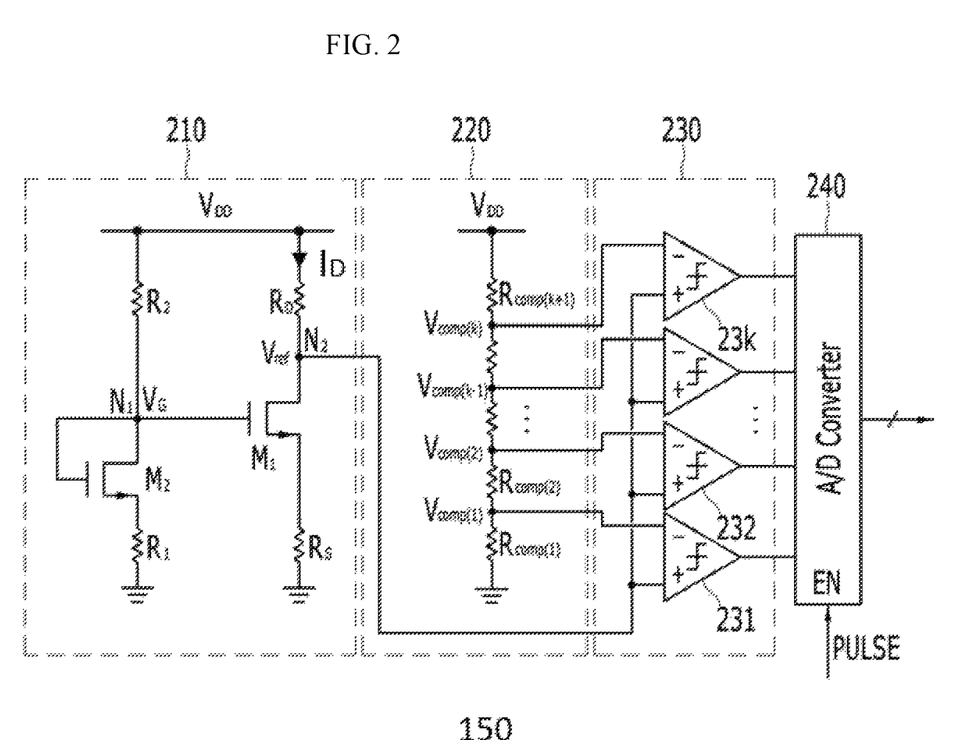
FIG. 2 illustrates a supply voltage monitor in accordance with an embodiment.

FIG. 2 illustrates the supply voltage monitor 150 shown in FIG. 1 in accordance with an embodiment.

The supply voltage monitor 150 includes a reference voltage generation circuit 210, a comparison voltage generation circuit 220, a comparison circuit 230, and an analog-to-digital converter (ADC) 240.

The reference voltage generation circuit 210 includes resistors $R_1$, $R_2$, $R_D$, and $R_S$, first and second NMOS transistors $M_1$ and $M_2$. The resistor $R_2$, the second NMOS transistor $M_2$, and the resistor $R_1$ are coupled in series between a supply voltage VDD and a ground voltage. The gate of the second NMOS transistor $M_2$ is coupled to a node $N_1$ between the resistor $R_2$ and the drain of the second NMOS transistor $M_2$, and a gate voltage VG is generated from the node $N_1$. Furthermore, the resistor $R_D$, the first NMOS transistor $M_1$, and the resistor $R_S$ are coupled in series between the supply voltage VDD and the ground voltage. The gate voltage VG generated from the node $N_1$ is applied to the gate of the first NMOS transistor $M_1$, and the reference voltage Vref is outputted from a node $N_2$ between the resistor $R_D$ and the drain of the first NMOS transistor $M_1$. When the supply voltage VDD drops below the predetermined supply voltage, the gate voltage VG of the transistor $M_1$ is also lowered. If the gate voltage VG of the transistor $M_1$ is lowered, the amount of the current $I_D$ flowing through the transistor $M_1$ is decreased. The reference voltage Vref may be represented as VDD–$I_D$*$R_D$. As a result, when the supply voltage VDD drops below the predetermined supply voltage and the amount of the current $I_D$ flowing through the transistor $M_1$ is decreased, the reference voltage Vref may be kept at a substantially constant level (or a predetermined level).=>amended Therefore, even if the supply voltage VDD deviates from the predetermined supply voltage, the reference voltage generation circuit 210 generates the reference voltage Vref having a predetermined level, even though the supply voltage VDD is increased or decreased to a predetermined extent or more.

The comparison voltage generation circuit 220 includes a plurality of resistors $R_{comp(1)}$ to $R_{comp(k+1)}$ coupled in series between the supply voltage VDD and the ground voltage, and outputs a plurality of comparison voltages $V_{comp(1)}$ to $V_{comp(k)}$ having different levels through respective nodes, each of the nodes being disposed between a pair of adjacent resistors among the plurality of resistors $R_{comp(1)}$ to $R_{comp(k+1)}$.

The comparison circuit 230 includes a plurality of comparators 231 to 23k which compare the reference voltage Vref to the comparison voltages $V_{comp(1)}$ to $V_{comp(k)}$, respectively, and output a plurality of comparison signals (e.g., analog comparison signals) indicating respective comparison results.

The ADC 240 converts the analog comparison signals outputted from the comparison circuit 230 into a digital signal (e.g., the switching logic signal Switching Logic in FIG. 1, which is composed of digital thermometer codes) according to the divided pulse PULSE.

Figure 3:
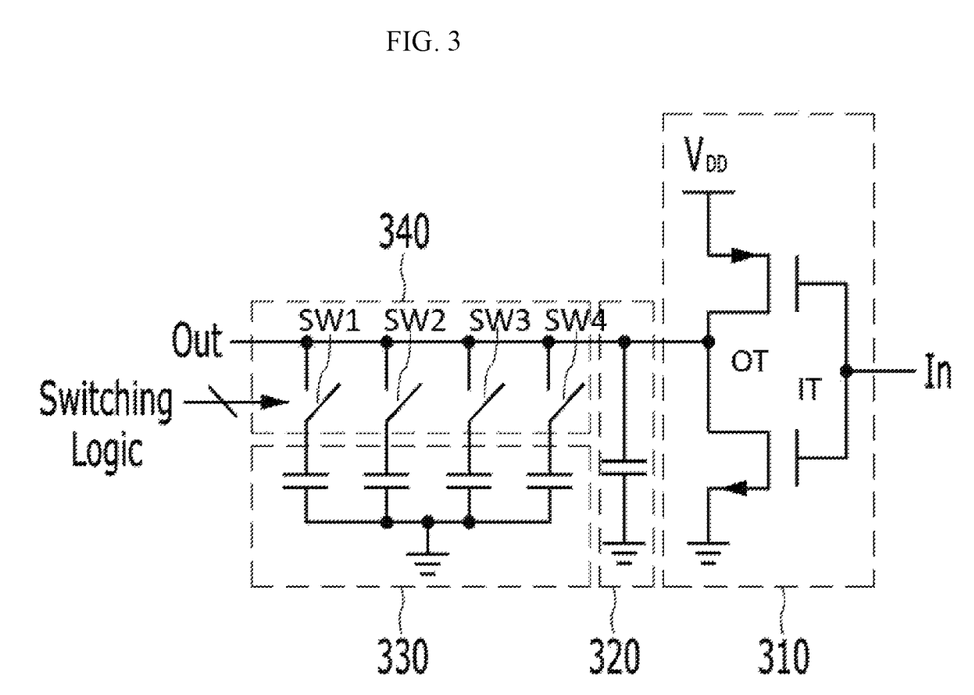
FIG. 3 is a detailed circuit diagram of a ring oscillator in accordance with an embodiment.

FIG. 3 illustrates an inverter within the ring oscillator 110 of FIG. 1 in accordance with an embodiment.

The inverter in FIG. 3 includes a CMOS inverter 310, a fixed capacitor 320, a plurality of load capacitors 330, and a load capacitor switch group 340.

The CMOS inverter 310 is disposed between a supply voltage VDD and a ground voltage, and operates according to an input signal In applied to an input terminal IT.

The fixed capacitor 320 is disposed between an output terminal OT of the CMOS inverter 310 and the ground voltage.

The plurality of load capacitors 330 couple the output terminal of the CMOS inverter 310 to the ground voltage through respective load capacitor switches SW1 to SW 4 of the load capacitor switch group 340.

The load capacitor switches SW1 to SW4 within the load capacitor switch group 340 are switched (i.e., turned on or off) by the switching logic signal Switching Logic outputted from a supply voltage monitor (e.g., the supply voltage monitor 150 in FIG. 2). A capacitance value (or a variable capacitance value) of the plurality of load capacitors 330 varies with a number of turned on switches among the load capacitor switches SW1 to SW4 and respective capacitance values of the load capacitor switches SW1 to SW4. Thus, a total capacitance value of the inverter shown in FIG. 2, which is substantially equal to the sum of the fixed capacitance value of the fixed capacitor 320 and the variable capacitance value of the load capacitors 330, may be adjusted with the number of turned on switches among the load capacitor switches SW1 to SW4.

According to the adjusted total capacitance value, the width of an output signal Out outputted from the CMOS inverter 310 disposed between the supply voltage VDD and the ground voltage is adjusted. Here, the input terminal IT of the CMOS inverter 310 corresponds to a node which couples the gate terminal of a PMOS transistor and the gate terminal of an NMOS transistor, and the output terminal OT of the CMOS inverter 310 corresponds to a node which couples the drain terminal of the PMOS transistor and the drain terminal of the NMOS transistor, the PMOS transistor and the NMOS transistor being coupled in series between the supply voltage VDD and the ground voltage.

An operation of a temperature sensor circuit (e.g., the temperature sensor circuit 100 in FIG. 1) according to an embodiment will be described below in more detail with reference to FIGS. 2 and 3. Referring to FIG. 2, for example, when the supply voltage VDD has a level (e.g., 0.90V) less than a given level (e.g., 1.0V), the comparison voltages $V_{comp(1)}$ to $V_{comp(k)}$ have smaller levels compared to corresponding levels when the supply voltage $V_{DD}$ has the given level. Because the reference voltage $V_{ref}$ has a substantially constant level regardless of the level of the supply voltage $V_{DD}$, the ADC 240 may output the switching logic signal Switching Logic having a greater value compared to that when the supply voltage $V_{DD}$ has the given level. Referring to FIG. 3, for example, when the load capacitor switches SW1 to SW4 of the load capacitor switch group 340 are PMOS transistors, a number of turned on PMOS transistors decreases in response to the switching logic signal having the greater value compared to when the supply voltage has the given level. Thus, the variable capacitance value of the load capacitors 330 is decreased, thereby decreasing the total capacitance value of the inverter shown in FIG. 3. As a result, assuming that a propagation delay of the CMOS inverter 310 has been increased due to the reduced level of the supply voltage $V_{DD}$, the decreased total capacitance value of the inverter may reduce a delay associated with the total capacitance value, thereby maintaining a total delay of the inverter within a given range. Referring back to FIG. 1, because the total delay of each of a plurality of inverters in the ring oscillator 110 remains substantially the same regardless of a change in the supply voltage $V_{DD}$, the temperature sensor circuit 100 may detect a temperature of a semiconductor device accurately even when the supply voltage VDD has a level different from the given level.

Figure 4:
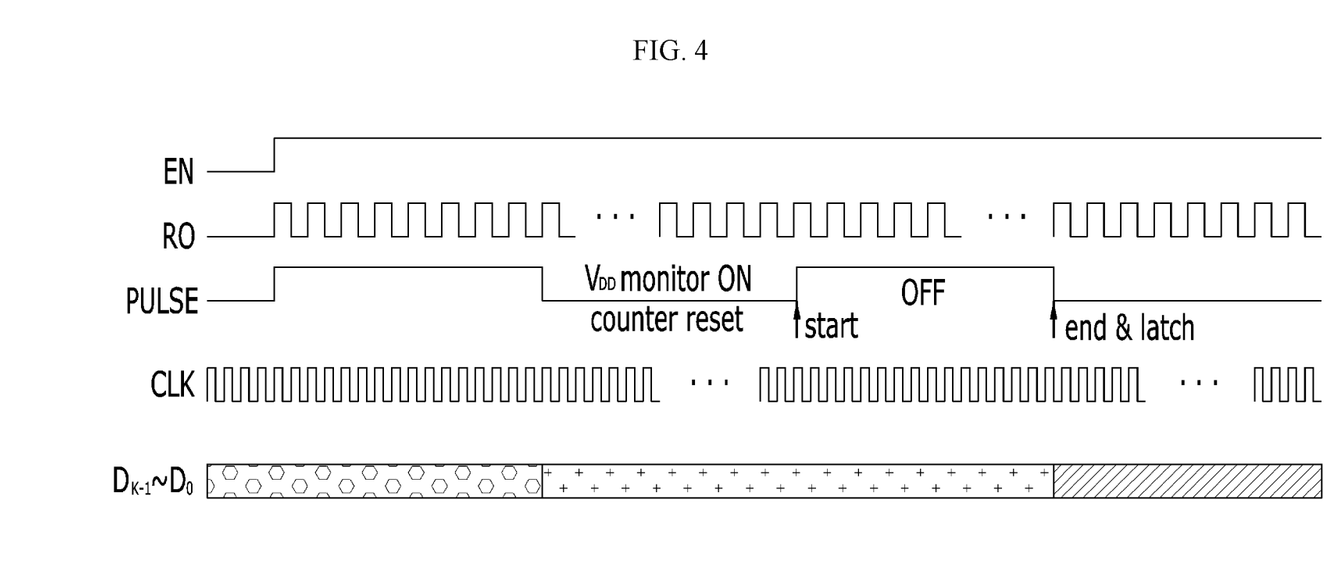
FIG. 4 illustrates waveforms related to an operation of the temperature sensor circuit of FIG. 1 in accordance with an embodiment.

FIG. 4 illustrates waveforms of signals EN, RO, PULSE, CLK, and $D_{K-1} \sim D_0$ related to an operation of the temperature sensor circuit 100 of FIG. 1, in accordance with an embodiment.

Referring to FIG. 1, when the ring oscillator 110 outputs the square wave signal RO according to the enable signal EN applied from outside, the divider 120 divides the square wave signal RO by 16, and outputs the divided pulse PULSE.

After the supply voltage monitor 150 is turned on and the counter 130 is reset, the counter 130 detects a temperature by counting a time from a start point to an end point of the divided pulse PULSE which differs depending on the temperature, based on the clock signal CLK, and the latch 140 for temporarily storing a count value of the counter 130 outputs the digital code $D_{k-1}$ to $D_0$ indicating the temperature. For example, the counter 130 counts a number of pulses of the clock signal CLK included in an on-time duration of the divided pulse PULSE, thereby counting the time from the start point and the end point of the divided pulse PULSE.

Figure 5:
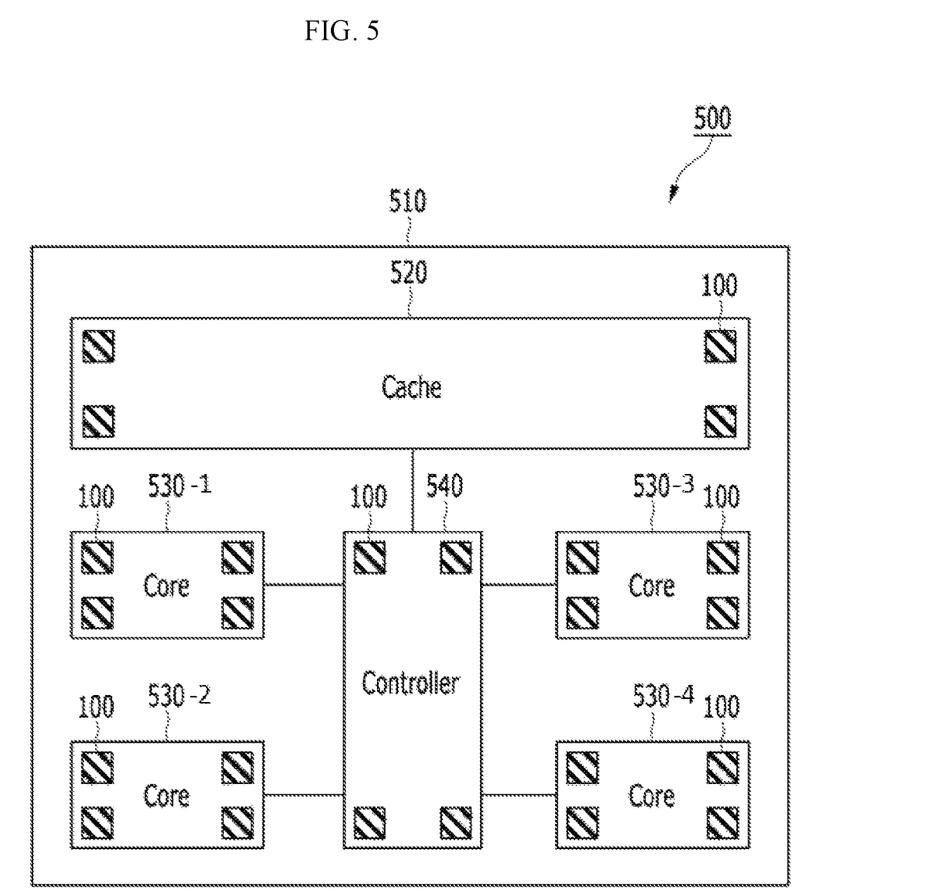
FIG. 5 illustrates a semiconductor device including a temperature sensor circuit in accordance with an embodiment.

FIG. 5 illustrates a semiconductor device 500 including one or more of temperature sensor circuits (e.g., the temperature sensor circuit 100 in FIG. 1) in accordance with an embodiment.

The semiconductor device 500 includes a plurality of circuits 520, 530-1, 530-2, 530-3, 530-4, and 540 disposed on a semiconductor substrate 510, each of which includes one or more temperature sensor circuits 100.

The plurality of circuit units 520 to 540 may include a cache 520, a plurality of cores (or first, second, third, and fourth cores) 530-1, 530-2, 530-3, and 530-4, and a controller 540, for example. The plurality of cores 530-1, 530-2, 530-3, and 530-4 may perform different circuit functions, or one or more of the plurality of cores 530-1, 530-2, 530-3, and 530-4 may perform substantially the same circuit function.

Since the semiconductor device 500 is a large-scale integrated circuit, temperatures of the semiconductor substrate 510 constituting the semiconductor device 500 may differ depending on positions where the temperatures are measured. Therefore, one or more of the temperature sensor circuits 100 may be installed in each of the circuits 520 to 540. In the embodiment shown in FIG. 5, four temperature sensor circuits 100 are installed in each of the circuits 520 to 540. However, embodiments of the present disclosure are not limited thereto.

In response to one or more output signals from the temperature sensor circuits 100, operations of one or more of the circuits 520 to 540 each including corresponding temperature sensor circuits 100 therein may be stopped. Furthermore, the stopped circuits among the circuits 520 to 540 by the one or more output signals of the temperature sensor circuits 100 may be determined in advance. For example, only a circuit which can effectively lower a temperature of the substrate 510 may be stopped based on the output signals.

Furthermore, one or more output signals of the plurality of temperature sensor circuits 100 may be inputted to a substrate temperature control circuit (not illustrated) of the controller 540, for example. In this case, the substrate temperature control circuit periodically monitors the output signals of the respective temperature sensor circuits 100 in a predetermined order, and controls the operation of the semiconductor device 500 based on the monitoring result. For example, when an output signal from a specific temperature sensor circuit (e.g. the temperature sensor circuit 100 in the first core 530-1) indicates a high value, the operation of a circuit (e.g., the first core 530-1) including the specific temperature sensor circuit 100 may be stopped, while the remaining circuits perform operations continuously. In another embodiment, the entire operation of the semiconductor device 500 may be stopped based on the above-described monitoring result. In yet another embodiment, the operation of the circuit (e.g., the first core 530-1) including the specific temperature sensor circuit 100 and the operations of the circuits (e.g., the second core 530-2 and the cache 520) adjacent thereto may be stopped. In still yet another embodiment, only the operations of circuits adjacent to the circuit including the specific temperature sensor circuit 100 may be stopped based on the monitoring result.

In accordance with embodiments of the present disclosure, a temperature sensor circuit can accurately perform temperature detection by compensating for a change in a propagation delay, which may result from one or more of supply voltages that are provided to the semiconductor device and have values different from a given value.

Although various embodiments have been described for illustrative purposes, it will be apparent to those skilled in the art that various changes and modifications may be possible.

What is claimed is:

1. A temperature sensor circuit comprising:
   a ring oscillator suitable for being enabled according to an enable signal, and outputting a square wave signal with a first frequency;
   a divider suitable for dividing the first frequency of the square wave signal from the ring oscillator to generate a pulse signal with a second frequency;
   a counter suitable for counting a time interval of the pulse signal outputted from the divider according to an external clock to generate a count signal;
   a latch suitable for temporarily storing a value of the counter signal according to the pulse signal, and outputting a digital code; and
   a supply voltage monitor suitable for being enabled according to the pulse signal, comparing a reference voltage to one or more comparison voltages and generating a switching logic signal, the reference voltage being kept at a substantially constant level when a level of a supply voltage changes.

2. The temperature sensor circuit of claim 1, wherein the supply voltage monitor comprises:
   a reference voltage generation circuit suitable for receiving the supply voltage and generating the reference voltage;
   a comparison voltage generation circuit suitable for generating the comparison voltages having different levels that are proportional to the level of the supply voltage;
   a comparison circuit suitable for comparing the reference voltage and the comparison voltages and generating a plurality of comparison signals indicating respective comparison values; and
   an analog-to-digital converter suitable for converting value of the plurality of comparison signals into digital values and generating the switching logic signal indicative of the digital values.

3. The temperature sensor circuit of claim 2, wherein the ring oscillator comprises a plurality of inverters, each of the plurality of inverters comprising:
   a CMOS inverter coupled between the supply voltage and a ground and operating according to an input signal applied thereto;
   a fixed capacitor coupled to an output terminal of the CMOS inverter and the ground;
   a load capacitor switch group including a plurality of load capacitor switches that are switched according to the switching logic signal; and
   a plurality of load capacitors coupled to the plurality of load capacitor switches, respectively,
   wherein each of the plurality of load capacitors couples the output terminal of the CMOS inverter to the ground when a corresponding one of the plurality of load capacitor switches is turned on.

4. The temperature sensor circuit of claim 2, wherein the reference voltage generation circuit comprises:
   a first transistor coupled between a first resistor and a second resistor and having a gate and a drain coupled to each other at a first node, the first node outputting a gate voltage; and
   a second transistor coupled between a third resistor and a fourth resistor and having a gate receiving the gate voltage from the first node and a drain coupled to a second node, the second node outputting the reference voltage.

5. The temperature sensor circuit of claim 2, wherein a comparison voltage generation circuit includes a plurality of resistors coupled in series between the supply voltage and a ground.

6. The temperature sensor circuit of claim 5, wherein the comparison voltage generation circuit further includes a plurality of nodes outputting the comparison voltages, respectively, each of the plurality of nodes being disposed between adjacent ones of the plurality of resistors.

7. The temperature sensor circuit of claim 2, the comparison circuit includes a plurality of comparators, each of the plurality of comparators having a non-inverting input that receives the reference voltage and an inverting input that receives a corresponding one of the comparison voltages.

8. The temperature sensor circuit of claim 1, wherein the counter calculates a number of a plurality of pulses of the external clock during an on-time duration of the pulse signal.

9. The temperature sensor circuit of claim 1, wherein the ring oscillator comprises a plurality of inverters, and
   wherein the supply voltage monitor compensates for a change in a propagation delay of each of the plurality of inverters by adjusting a value of the switching logic signal, the change in the propagation delay resulting from a change in the level of the supply voltage.

10. The temperature sensor circuit of claim 9, wherein each of the plurality of inverters comprises:
   a CMOS inverter coupled between the supply voltage and a ground and operating according to an input signal applied thereto;
   a load capacitor switch group including a plurality of load capacitor switches that are switched according to the switching logic signal; and
   a plurality of load capacitors coupled to the plurality of load capacitor switches, respectively, and
   wherein each of the plurality of load capacitors couples an output terminal of the CMOS inverter to the ground when a corresponding one of the plurality of load capacitor switches is turned on.

11. The temperature sensor circuit of claim 10, wherein each of the plurality of inverters further comprises a fixed capacitor coupled to the output terminal of the CMOS inverter and the ground.

12. A semiconductor device comprising:
 a first circuit disposed on a first portion of a semiconductor substrate; and
 a second circuit disposed on a second portion of the semiconductor substrate,
 wherein each of the first and second circuits comprises a temperature sensor circuit, the temperature sensor circuit comprising:
 a ring oscillator suitable for being enabled according to an enable signal, and outputting a square wave signal with a first frequency;
 a divider suitable for dividing the first frequency of the square wave signal from the ring oscillator to generate a pulse signal with a second frequency;
 a counter suitable for counting a time interval of the pulse signal outputted from the divider according to an external clock to generate a count signal;
 a latch suitable for temporarily storing a value of the counter signal according to the pulse signal, and outputting a digital code; and
 a supply voltage monitor suitable for being enabled according to the pulse signal, comparing a reference voltage to one or more comparison voltages and generating a switching logic signal, the reference voltage being kept at a substantially constant level when a level of a supply voltage changes.

13. The semiconductor device of claim 12, wherein the ring oscillator comprises a plurality of inverters, and
 wherein the supply voltage monitor compensates for a change in a propagation delay of each of the plurality of inverters by adjusting a value of the switching logic signal, the change in the propagation delay resulting from a change in the level of the supply voltage.

14. The temperature sensor circuit of claim 13, wherein each of the plurality of inverters comprises:
 a CMOS inverter coupled between the supply voltage and a ground, and operating according to an input signal applied thereto;
 a load capacitor switch group including a plurality of load capacitor switches that are switched according to the switching logic signal; and
 a plurality of load capacitors coupled to the plurality of load capacitor switches, respectively, and
 wherein each of the plurality of load capacitors couples an output terminal of the CMOS inverter to the ground when a corresponding one of the plurality of load capacitor switches is turned on.

15. The temperature sensor circuit of claim 14, wherein each of the plurality of inverters further comprises a fixed capacitor coupled to the output terminal of the CMOS inverter and the ground.

16. The semiconductor device of claim 12, wherein the reference voltage generation circuit comprises:
 a first transistor coupled between a first resistor and a second resistor and having a gate and a drain coupled to each other at a first node, the first node outputting a gate voltage; and
 a second transistor coupled between a third resistor and a fourth resistor and having a gate receiving the gate voltage from the first node and a drain coupled to a second node, the second node outputting the reference voltage.

17. The semiconductor device of claim 12, wherein a comparison voltage generation circuit includes a plurality of resistors coupled in series between the supply voltage and a ground.

18. The semiconductor device of claim 17, wherein the comparison voltage generation circuit further includes a plurality of nodes outputting the comparison voltages, respectively, each of the plurality of nodes being disposed between adjacent ones of the plurality of resistors.

19. A semiconductor device comprising:
 a first circuit disposed on a first portion of a semiconductor substrate; and
 a second circuit disposed on a second portion of the semiconductor substrate,
 wherein each of the first and second circuits comprises a temperature sensor circuit, the temperature sensor circuit comprising:
 a ring oscillator suitable for being enabled according to an enable signal, and outputting a square wave signal with a first frequency;
 a divider suitable for dividing the first frequency of the square wave signal from the ring oscillator to generate a pulse signal with a second frequency;
 a counter suitable for counting a time interval of the pulse signal outputted from the divider according to an external clock to generate a count signal;
 a latch suitable for temporarily storing a value of the counter signal according to the pulse signal, and outputting a digital code; and
 a supply voltage monitor suitable for being enabled according to the pulse signal, comparing a reference voltage to one or more comparison voltages and generating a switching logic signal, the reference voltage being kept at a substantially constant level when a level of a supply voltage changes, and
 wherein the supply voltage monitor comprises:
 a reference voltage generation circuit suitable for receiving the supply voltage and generating the reference voltage;
 a comparison voltage generation circuit suitable for generating the comparison voltages having different levels that are proportional to the level of the supply voltage;
 a comparison circuit suitable for comparing the reference voltage and the comparison voltages and generating a plurality of comparison signals indicating respective comparison values; and
 an analog-to-digital converter suitable for converting value of the plurality of comparison signals into digital values and generating the switching logic signal indicative of the digital values.

20. The semiconductor device of claim 19, wherein the ring oscillator comprises a plurality of inverters, and
 wherein the supply voltage monitor compensates for a change in a propagation delay of each of the plurality of inverters by adjusting a value of the switching logic signal, the change in the propagation delay resulting from a change in the level of the supply voltage.

* * * * *